United States Patent
Ratakonda et al.

(10) Patent No.: US 8,912,104 B1
(45) Date of Patent: Dec. 16, 2014

(54) METHOD FOR FABRICATING INTEGRATED CIRCUITS WITH PATTERNED THERMAL ADJUSTMENT LAYERS FOR DESIGN OPTIMIZATION

(75) Inventors: Deepa Ratakonda, San Jose, CA (US); Christopher J. Pass, San Jose, CA (US); Che Ta Hsu, San Jose, CA (US); Fangyun Richter, San Jose, CA (US); Wilson Wong, San Francisco, CA (US)

(73) Assignee: Altera Corporation, San Jose, CA (US)

( * ) Notice: Subject to any disclaimer, the term of this patent is extended or adjusted under 35 U.S.C. 154(b) by 278 days.

(21) Appl. No.: 13/047,664

(22) Filed: Mar. 14, 2011

(51) Int. Cl.
*H01L 21/26* (2006.01)
*H01L 21/324* (2006.01)
*H01L 21/42* (2006.01)
*H01L 21/477* (2006.01)

(52) U.S. Cl.
USPC ............ 438/799; 438/308; 438/948; 438/952

(58) Field of Classification Search
USPC .................................. 438/308, 799, 948, 952
See application file for complete search history.

(56) References Cited

U.S. PATENT DOCUMENTS

| | | | |
|---|---|---|---|
| 5,858,826 A | 1/1999 | Lee et al. | |
| 6,251,777 B1 | 6/2001 | Jeng et al. | |
| 6,551,888 B1 * | 4/2003 | Tabery et al. | 438/308 |
| 6,632,729 B1 | 10/2003 | Paton | |
| 6,825,052 B2 * | 11/2004 | Eldridge et al. | 438/15 |
| 8,138,105 B2 * | 3/2012 | Timans | 438/799 |
| 8,362,560 B2 * | 1/2013 | Kulkarni et al. | 257/350 |
| 2007/0262791 A1 * | 11/2007 | Pfefferl | 326/86 |

* cited by examiner

*Primary Examiner* — Howard Weiss
(74) *Attorney, Agent, or Firm* — Treyz Law Group; Jason Tsai

(57) ABSTRACT

An integrated circuit may include a substrate in which transistors are formed. The transistors may be associated with blocks of circuitry. Some of the blocks of circuitry may be configured to reduce leakage current. A selected subset of the blocks of circuitry may be selectively heated to reduce the channel length of their transistors through dopant diffusion and thereby strengthen those blocks of circuitry relative to the other blocks of circuitry. Selective heating may be implemented by coating the blocks of circuitry on the integrated circuit with a patterned layer of material such as a patterned anti-reflection coating formed of amorphous carbon or a reflective coating. During application of infrared light, the coated and uncoated areas will rise to different temperatures, selectively strengthening desired blocks of circuitry on the integrated circuit.

14 Claims, 7 Drawing Sheets

METHOD FOR FABRICATING INTEGRATED CIRCUITS WITH PATTERNED THERMAL ADJUSTMENT LAYERS FOR DESIGN OPTIMIZATION

BACKGROUND

Photolithographic masks are used during the fabrication of integrated circuits. Masks are used, for example, to define the shapes and sizes of gates, sources, drains, and other structures associated with the transistors on an integrated circuit. In some process steps, layers of material are deposited. In other process steps, masks are used to define etch patterns that selectively remove parts of deposited layers. Ion implantation steps are used to dope semiconductor regions.

To ensure that integrated circuits can be fabricated economically, care must be taken to avoid the use of an excessive number of masks and process steps. At the same time, designs should be optimized to implement suitable tradeoffs. For example, transistors should exhibit desired strengths, without becoming so strong that they exhibit excessive leakage currents.

In designing economical circuits that exhibit a satisfactory balance between various design criteria, it is often difficult to maintain low mask counts. For example, it might be possible to lower overall power consumption on an integrated circuit by reducing transistors strength globally while increasing transistor strength in only a localized area on an integrated circuit. A localized transistor strength increase might be implemented, for example, using localized transistor size changes, localized implants, or localized gate insulator thicknesses. While this type of approach may be satisfactory for optimizing circuit performance, the additional masks and process steps that are generally required may be overly costly, complex, and time consuming.

SUMMARY

An integrated circuit may include a substrate in which transistors are formed. The substrate may include a p-type silicon substrate layer or other substrate layer on which wells are formed.

Transistors may be formed within a well layer. The transistors may include source-drain terminals that lie on opposing sides of a channel. The channel may lie underneath a gate conductor such as a gate of polysilicon. Initially, some of the transistors on the integrated circuit may have identical gate conductor lengths. Following selective application of heat, source-drain dopant in transistors that are raised to higher temperatures will tend to diffuse and narrow the channel length of some of the transistors, thereby strengthening those transistors.

The transistors may be associated with blocks of circuitry. Some of the blocks of circuitry may be configured to reduce leakage current. Based on analysis performed by computer-aided design tools, a selected subset of the blocks of circuitry may be heated to reduce the channel length of the transistors in these blocks through dopant diffusion and thereby strengthen these blocks of circuitry relative to the other blocks of circuitry.

Selective heating may be implemented by coating the blocks of circuitry on the integrated circuit with a patterned layer of material such as a patterned anti-reflection coating formed of amorphous carbon or a patterned reflective coating. During application of infrared light, the coating and uncoated areas will rise to different temperatures, selectively strengthening desired blocks of circuitry on the integrated circuit.

The computer-aided design tools may analyze a circuit design to produce a layout for patterned interconnect masks in a masked-programmed integrated circuit. The computer-aided design tools may also determine where to incorporate selective heating into the integrated circuit and can produce an associated mask for patterning the anti-reflection coating layer or other thermal absorption adjustment layer.

Blocks of circuits that can be selectively heated using the patterned layer of material include transceiver blocks, processing circuit blocks that benefit from rapid transistor switching times, and other circuits where elevated switching performance tends to be desirable. Blocks of circuits that can be heated to lower temperatures during selective heating operation include slower logic circuits and circuits for which reduced leakage currents are preferred over maximum switching speed.

Further features of the invention, its nature and various advantages will be more apparent from the accompanying drawings and the following detailed description of the preferred embodiments.

DETAILED DESCRIPTION

To optimize the design of an integrated circuit, a layer of patterned material may be deposited over the integrated circuit. Heat may be applied to the integrated circuit using an infrared lamp (e.g., a lamp in a rapid thermal annealing tool that emits infrared light), using a furnace, or other heat source. The layer of material may have anti-reflection properties to locally increase heat absorption or may be reflective to locally decrease heat absorption. Because the layer of patterned material affects heat absorption across the integrated circuit, the transistors that are being fabricated on the integrated circuit will be raised to different temperatures as heat is applied. As a result, some transistors are locally strengthened relative to others, allowing the overall design of the integrated circuit to be optimized.

The layer of patterned material may be from one or more layers of oxide, nitride, polymer, amorphous materials, elemental metals, metal alloys, other materials, or any combination thereof. With one suitable arrangement, which is sometimes described herein as an example, the layer of patterned material that is deposited to locally adjust the amount of heat that is absorbed by the integrated circuit during processing may be formed from amorphous carbon. In general, any suitable layer of material that can be patterned using semiconductor fabrication techniques and that locally affects the amount of heat that is absorbed during application of heat (infrared light) to the integrated circuit may be used.

A layer of material such as a layer of amorphous carbon that forms an anti-reflection coating may enhance heat absorption (relative to areas that are uncoated by the layer). As such, the layer of amorphous carbon forming the anti-reflection coating may sometimes be referred to as heat-absorbing layer. A desired localized heat absorption pattern may be produced by patterning a reflective layer so that covered areas are heated less than uncovered areas. Covering certain areas are covered with heat-absorbing material is an example and should not be construed as limiting the scope of the present invention.

Figure 1:
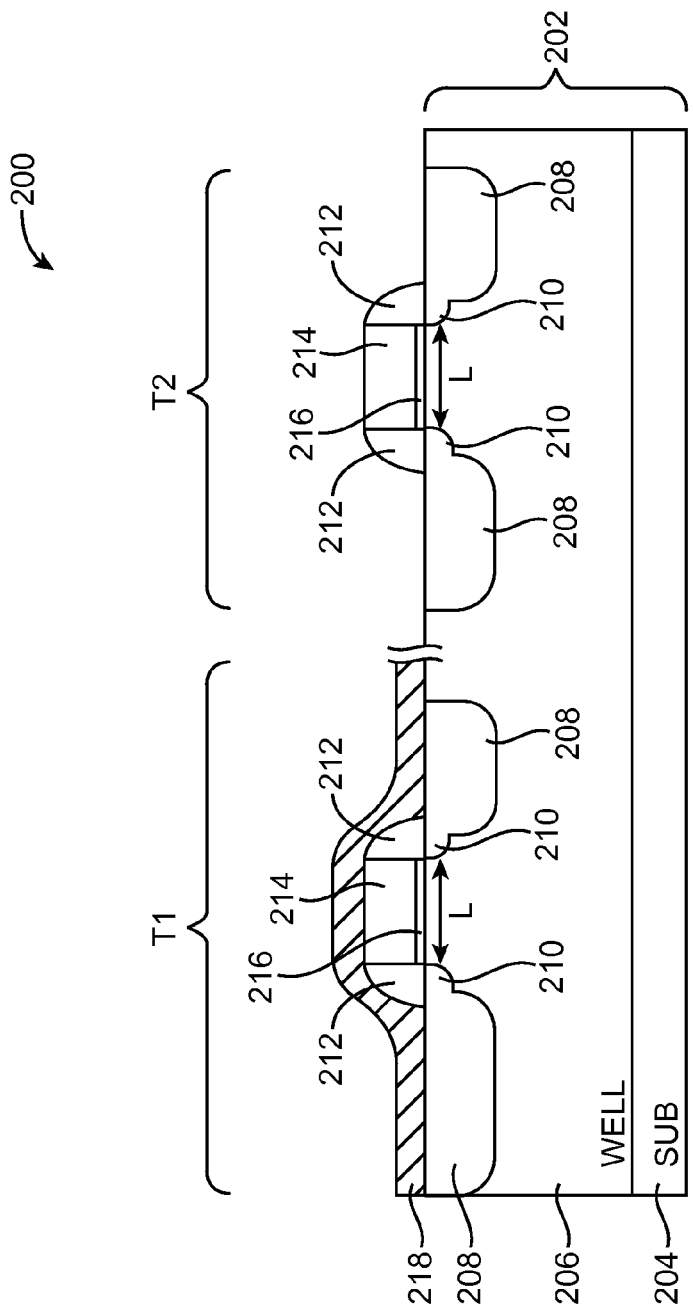
FIG. 1 is an exemplary cross-sectional side view of circuitry on an integrated circuit with a patterned thermal absorption adjustment layer in accordance with an embodiment of the present invention.

A portion of an illustrative integrated circuit that includes a patterned layer of heat-absorbing material is shown in FIG. 1. As shown in FIG. 1, integrated circuit 200 may have a substrate such as substrate 202. Substrate 202 may be formed, for example, from a silicon wafer. Portion 204 may be a p-type substrate layer (as an example) and portion 206 may be a doped well (e.g., an n-type silicon well or a p-type silicon well). Well 206 may form part of a well layer in the integrated circuit. If desired, other semiconductor materials (e.g., epitaxial silicon germanium sources and drains, etc.) may be used in forming the transistor structures of integrated circuit 200. The example of FIG. 1 is merely illustrative.

Transistors such as transistors T1 and T2 may be formed in the surface of substrate 202. As shown in FIG. 1, transistors T1 and T2 may have gate conductors 214. Gate conductors 214 may be formed from polysilicon or other gate conductors (e.g., metal, etc.). Dielectric spacers 212 may be formed on opposing sides of gate conductors 214. During ion implantation operations, source terminals and drain terminals (collectively referred to herein as source-drain terminals) such as terminals 208 and pocket implants may be formed in substrate 202.

There may be a lightly doped portion in the source-drain terminals such as lightly-doped drain (LDD) regions 210 under spacers 212. Gate insulator 216 (e.g., silicon oxide or other dielectric) may be formed under each gate conductor 214. The channel regions of transistors T1 and T2 may be formed in the portions of well region 206 that lie under gate insulators 216. Gate insulators 216 and gate conductors 214 of transistors T1 and T2 may, as an example, be identical in size (i.e., the width into the page of FIG. 1 and the length L across the page of FIG. 1 for gate conductors 214 and insulating layers 216 may be the same for both transistors T1 and T2). In this embodiment, the separation between the source-drain implant regions 208 of each transistor and therefore the channel length L of each transistor is initially identical. Following application of different temperatures to transistors T1 and T2 during processing, the channel lengths L and corresponding strengths of transistors T1 and T2 are different, while the length of gate conductors 214 of transistors T1 and T2 remain equal.

Transistors such as transistors T1 and T2 may be p-channel metal-oxide-semiconductor transistors (e.g., when well 206 is formed from n-type silicon and source-drain terminals 208 are formed from p+ semiconductor) or may be n-channel metal-oxide-semiconductor transistors (e.g., when well 206 is formed from p-type silicon and source-drain terminals 208 are formed from n+ semiconductor).

Patterned coating layer 218 may be used in applying different temperatures to transistors T1 and T2. In general, patterned coating layer 218 may be a heat-absorbing (anti-reflection) coating or a heat reflecting layer. For clarity, examples are sometimes described herein in which patterned coating layer 218 is a heat absorbing layer such as a layer of amorphous carbon. The use of amorphous carbon as a heat absorbing layer is merely illustrative and not intended to limit the scope of the present invention. Layer 218 may be any suitable layer that modifies the amount of infrared light that is absorbed in circuit 200.

In this example, layer 218 is formed from a layer of amorphous carbon, which facilitates heat absorption by acting as an anti-reflection coating for near infrared light. Layer 218 enhances the amount of heat (infrared light) per unit area that is absorbed in integrated circuit 200 when integrated circuit 200 is exposed to heat (infrared light). Heat may be applied, for example, during annealing or other heating steps during semiconductor manufacturing operations. When heat is applied to the surface of integrated circuit 200 while layer 218 of FIG. 1 is present, more heat will be absorbed in the structures of transistor T1 than in the structures of transistor T2. As a result, T1 is strengthened relative to T2 by causing the source-drain implants of transistor T1 to diffuse inwardly more than those of T2. In particular, channel length L in transistor T1 shrinks more than channel length L of transistor T2 as the source-drain dopant diffuses.

Figure 2:
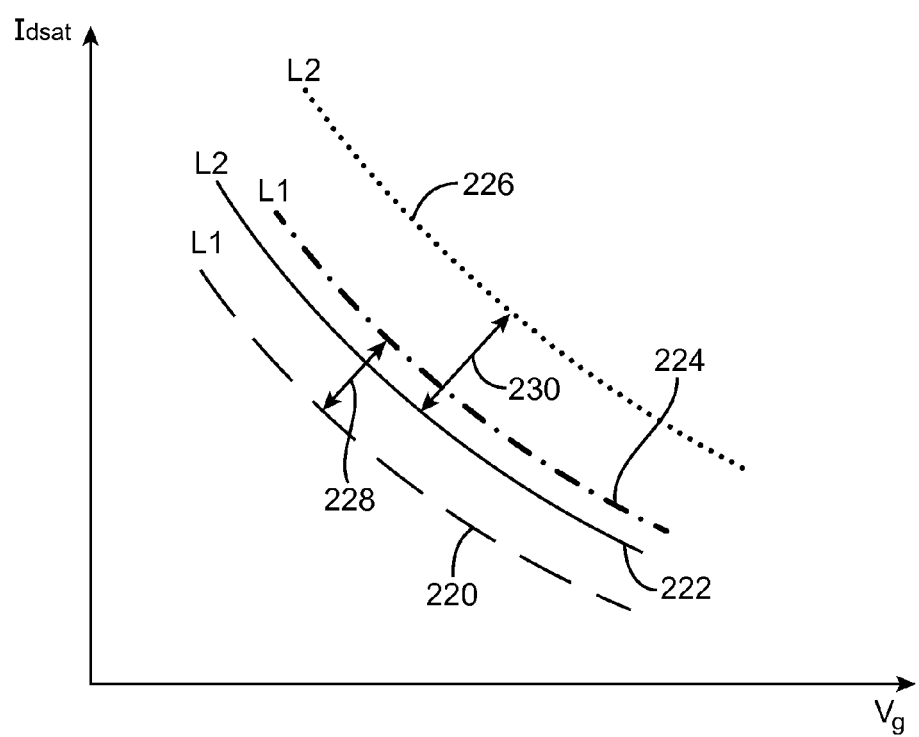
FIG. 2 is an exemplary graph of transistor performance adjusted locally during fabrication in accordance with an embodiment of the present invention.

Transistor strength may be characterized by current (Idsat) versus gate voltage (Vg) curves of the type shown in FIG. 2. At a given gate voltage Vg, stronger transistors exhibit larger Idsat Values than weaker transistors. During heat treatment, transistors exhibit increased Idsat (strength). Transistors with shorter gate lengths tend to experience more strength enhancement than transistors with longer gate lengths. In the FIG. 2 example, curve 220 corresponds to a transistor with a length L1 prior to heat treatment. Curve 222 corresponds to a transistor with a shorter gate length L2 prior to heat treatment. Following heat treatment, the transistor of length L1 may be characterized by curve 224 and the transistor of length L2 may be characterized by curve 226. As indicated by the longer length of line 228 compared to the length line 230, the strength of the short channel (L2) transistors increases more than the strength of the long channel (L1) transistors when subjected to the heat treatment and elevated temperatures. Difference in strength enhancement upon application of heat can be exploited by computer-aided design tools when analyzing a given logic design to determine how best to pattern the heat-absorbing layer (e.g., layer 218 of FIG. 1).

FIGS. 3, 4, 5, 6, and 7 are cross-sectional side views of substrate 202 in an integrated circuit with three sets of circuitry (200A, 200B, and 200C) at various stages during fabrication. Each set of circuitry (200A, 200B, and 200C) may include one or more transistors. The transistors of each set may have identical attributes (e.g., gate lengths and widths, oxide thicknesses, threshold-voltage-adjusting implants, channel types, etc.). However, it is appreciated that the transistors in each set may differ in one or more of these attributes. For example, the transistors in circuitry 200A, circuitry 200B, and/or circuitry 200C may include both n-type and p-type transistors, may include transistors of one or more gate insulator thicknesses, may include transistors with one or more threshold voltages, may include transistors with one or more different gate lengths, and may include transistors with one or more different gate lengths. In this example, two sets of transistors (e.g., circuitry 200A and 200B) are being heated more than one of the other sets of transistors (e.g., circuitry 200C). This is merely illustrative. Any suitable pattern of heat-absorbing (or reflecting) material may be used if desired.

Figure 3:
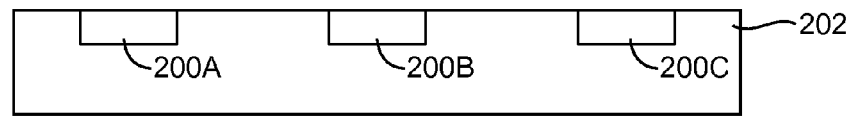
FIG. 3 is an exemplary cross-sectional side view of a portion of an integrated circuit prior to alteration of thermal absorption in accordance with an embodiment of the present invention.

Initially, as shown in FIG. 3, substrate 202 may include circuits 200A, 200B, and 200C. These circuits may each include n-channel and p-channel transistors, transistors of one or more gate lengths, transistors of one or more gate widths, transistors with one or more nominal threshold voltages, transistors with one or more gate insulator thicknesses, etc.

Figure 4:
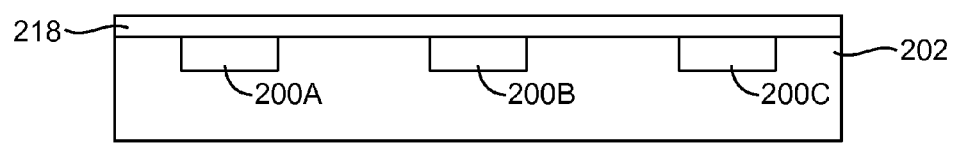
FIG. 4 is an exemplary cross-sectional side view of a portion of the integrated circuit of FIG. 3 subsequent to alteration of thermal absorption in accordance with an embodiment of the present invention.

As shown in FIG. 4, heat-absorbing layer 218 may be deposited as a blanket film over the surface of wafer 202, so that circuits 200A, 200B, and 200C are all covered.

Figure 5:
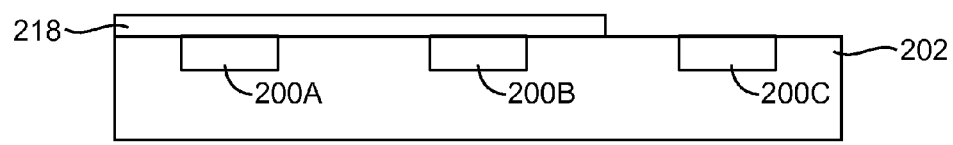
FIG. 5 is an exemplary cross-sectional side view of a portion of the integrated circuit of FIG. 4 following patterning in accordance with an embodiment of the present invention.

To locally heat some of the transistors more than others, layer 218 may be photolithographically patterned (e.g., using a patterned photoresist etch mask and dry etching), thereby producing a patterned heat-absorbing layer such as layer 218 of FIG. 5. In the FIG. 5 example, the transistors of circuits 200A and 200B are covered with heat-absorbing layer 218, whereas the transistors of circuits 200C are exposed and are uncovered by any of heat-absorbing layer 218.

Figure 6:
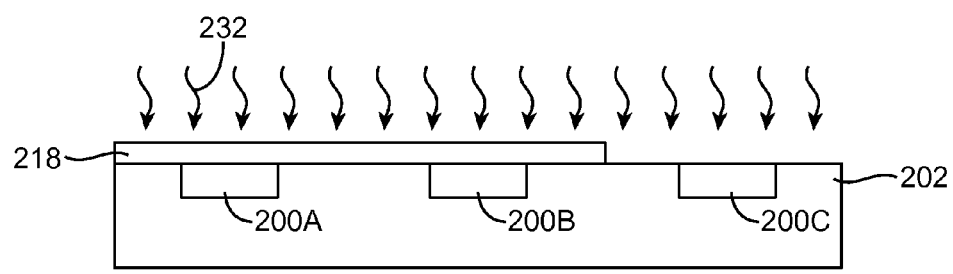
FIG. 6 is an exemplary cross-sectional side view of a portion of the integrated circuit of FIG. 5 during the application of heat for patterning in accordance with an embodiment of the present invention.
Figure 7:
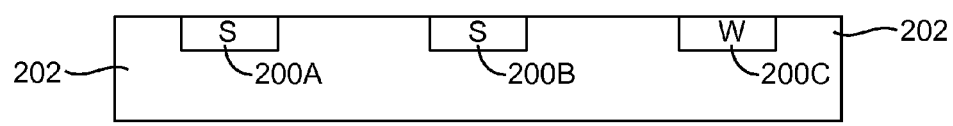
FIG. 7 is an exemplary cross-sectional side view of the integrated circuit of FIG. 6 following removal of the patterned layer of material in accordance with an embodiment of the present invention.

Following patterning of layer 218, heat 232 may be applied (e.g., from a near infrared lamp in a rapid thermal annealing tool or a furnace), as shown in FIG. 6. During heat treatment, the sets of transistors in circuit blocks 200A and 200B are heated more than the set of transistors in circuit block 200C. As a result, the transistors of circuits 200A and 200B will be stronger than the transistors of circuit 200C following the heat treatment of FIG. 6. This is indicated by the strong "S" and weak "W" labels in FIG. 7.

Figure 8:
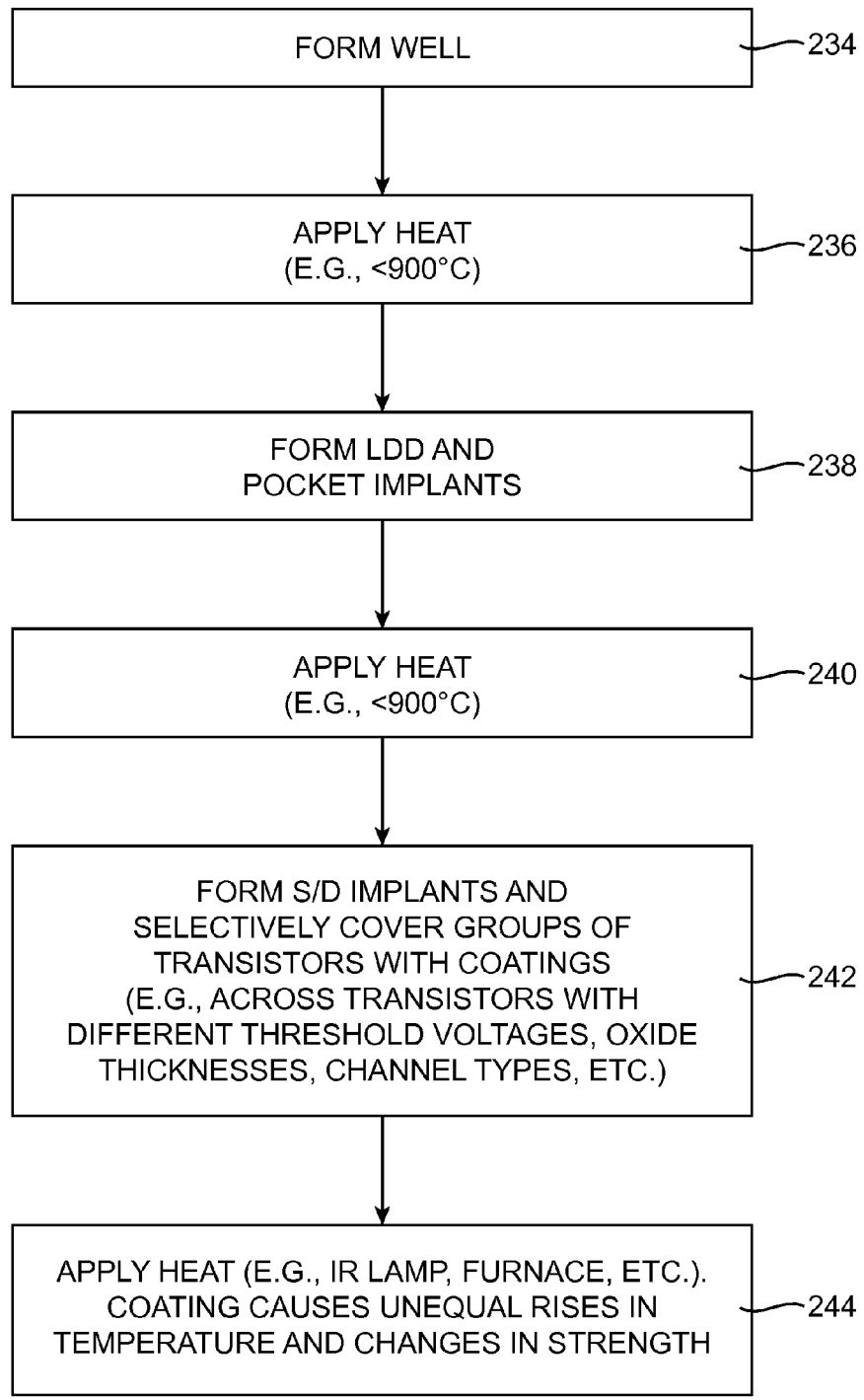
FIG. 8 is an exemplary flow chart of fabricating an integrated circuit in accordance with an embodiment of the present invention.

Illustrative operations involved in forming transistors on a substrate such as substrate 202 that is partially covered by heat-absorbing material are shown in FIG. 8.

At step 234, wells such as well 206 may be formed (e.g., by ion implantation).

At step 236, heat may be applied to activate the well implant and anneal out damage to the crystalline silicon of well 206. The applied heat of step 236 may raise the substrate to a temperature of less than 900° C. (as an example).

At step 238, lightly doped drain (LDD) implants may be used to form regions 210. Heat may then be applied at step 240 (e.g., heat that raises the substrate to a temperature of less than 900° C.).

During the operations of step 242, the rest of the transistor structures of transistors T1 and T2 of FIG. 1 may be formed and patterned layer 218 may be formed. Patterned heat-absorbing (or reflecting) layer 218 may be used to cover some circuits (e.g., a subset of the circuit blocks on the integrated circuit such as circuits 200A and 200B of FIG. 5), but not others (e.g., not the circuitry of circuit block 200C of FIG. 5).

During the operations of step 244, heat may be applied to the silicon substrate (e.g., heat that raises portions of the substrate to a temperature of 900° C. or more, to a temperature of 950° C. or more, or to a temperature of 1000° C. or more). In portions of the substrate where heat-absorbing layer 218 is present (or a heat reflecting layer is not present), the temperature of the substrate will rise more than in portions of the substrate where heat-absorbing layer 218 is not present (or the heat reflecting layer is present). As a result, desired blocks of transistors are selectively strengthened relative to other transistors. Short-channel transistors are strengthened more than long-channel transistors, as explained in connection with FIG. 2.

During design operations, a circuit designer may supply computer-aided design tools with a circuit design. The circuit design may contain portions that require the use of relatively strong transistors or that will at least benefit significantly from the use of relatively strong transistors. As an example, the circuit design may contain blocks of circuitry such as transceiver circuitry or digital signal processing circuitry (as examples) where enhanced transistor switching speeds are desirable. The computer-aided design tools may identify these areas and may create photolithographic masks for patterning layer 218 so that layer 218 covers these areas.

The circuit design may also contain portions in which transistor strength is not critical to meeting switching speed design goals. These portions of the circuit may, for example, contain circuits where slower switching speeds are acceptable. In circuitry where slow switching speeds are acceptable, it is generally desirable to reduce leakage currents by using relatively weaker transistors (i.e., transistors that are not locally strengthened by the local application of elevated temperatures using heat-absorbing layer 218). During design operations, the computer-aided design tools ensures that the layout used for heat-absorbing layer 218 does not cover the areas were weaker transistors are acceptable. These areas will therefore be exposed to lower temperature rises and will exhibit minimized leakage currents.

If desired, layer 218 can be patterned using a single mask (i.e., a single etch mask that defines which portions of layer 218 will be removed by dry etching). To ensure that this mask is not overly complex, each area of layer 218 that is created in the patterning process may be configured to cover a circuit block that include numerous transistors (e.g., ten or more transistors, one hundred or more transistors, one thousand or more transistors, or ten thousand or more transistors, as examples). Patterning the heat-absorbing layer in this way generally involves relatively uncomplicated masking and fabrication operations. For example, one relatively coarse mask may be used for defining the areas of patterned layer 218 and relatively few operations (e.g., a single dry etch operation) may be used in patterning layer 218, which can streamline the process of locally enhancing transistor strength.

Figure 9:
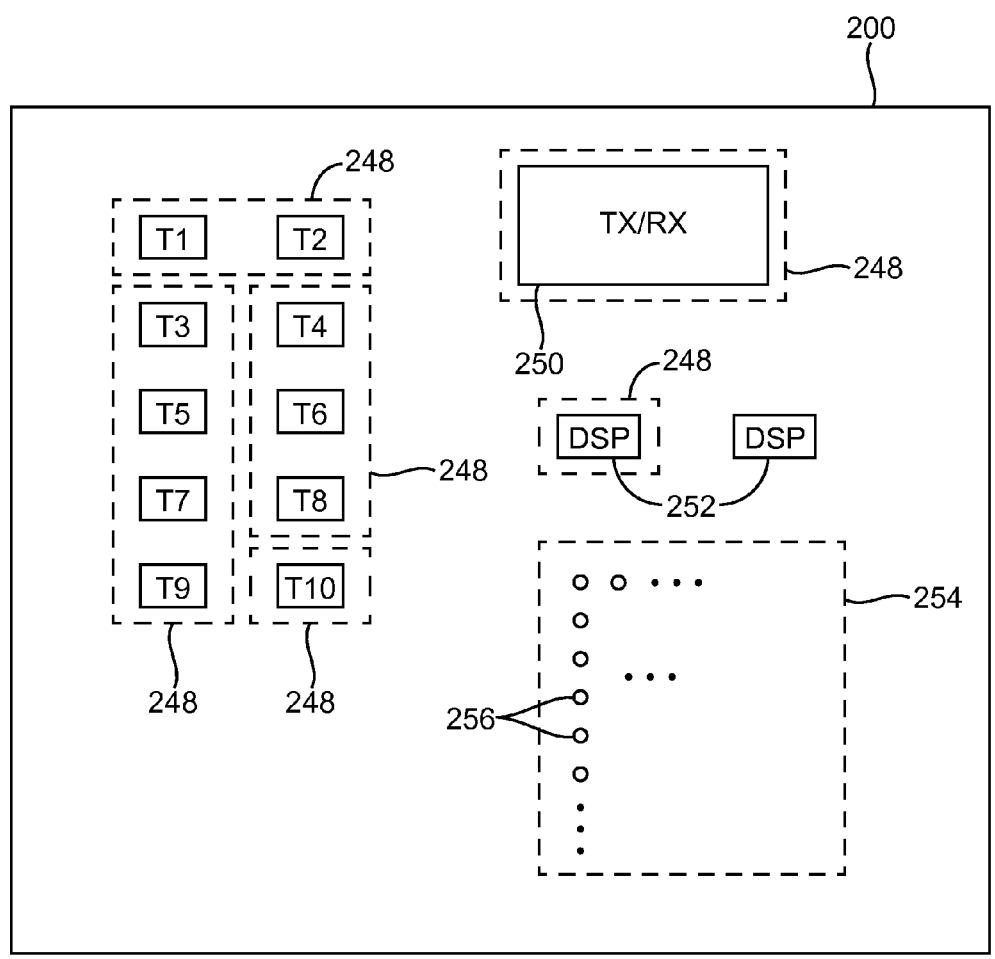
FIG. 9 is an exemplary top view of an integrated circuit comprising locally altered thermal absorption during heating operations in accordance with an embodiment of the present invention.

The illustrative layout of integrated circuit 200 that is shown in FIG. 9 uses this approach. In the FIG. 9 example, integrated circuit 200 includes transistors (T1, T2, T3 . . . ). These circuits may be used to form digital logic circuits, programmable interconnect paths (e.g., paths based on programmable multiplexers), or other logic circuitry. As shown in the layout of FIG. 9, the transistors in integrated circuit 200 may be used to form one or more blocks of transceiver circuitry 250 and one or more blocks of digital signal processing circuitry 252 (as examples). In some configurations of integrated circuit 200 (e.g., when integrated circuit 200 is a mask-programmed programmable integrated circuit of the type that is sometimes referred to as a structured application-specific integrated circuit), integrated circuit 200 may also have a region such as region 254 of mask-programmed vias such as vias 256. Computer-aided design tools can create masks that configure the pattern of vias in region 254 or other mask-programmed conductive paths to implement a user's custom logic design in integrated circuit 200.

Dashed lines 248 in FIG. 9 show potential areas were portions of patterned layer 218 may remain following etching to remove undesired portions of layer 218. The block of transistors that lie within each rectangular dashed line 248 may include one or more transistors of different channel types (e.g., n-type and/or p-type transistors), may include transistors of one or more gate insulator thicknesses, may include transistors with one or more threshold voltages, and may include transistors with one or more different gate lengths. When layer 218 is formed selectively over a given block 248, all of the transistors within the covered block may be exposed to a different temperature than the transistors within the blocks of circuitry that are not covered by layer 218. The use of the layer 218 therefore allows all of the transistors within the covered block to be strengthened together without using more detailed masks.

The mask that is used in patterning layer 218 may be produced for a user by a computer-aided design tool at the same time that other masks (e.g., customized via masks for patterning vias 256) are being produced. When the computer-aided design tools determine that a design constraint requires use of a strengthened block of transistors, the pattern for layer 218 may be adjusted to include an area of layer 218 to cover that block of transistors. If, for example, the computer-aided design tools determine that the transistors in transceiver circuit 250 should be strengthened (e.g., to ensure that high-speed input-output signals can be handled), a layout may be created for layer 218 that covers circuit 250 (e.g., a layout in which a portion of layer 218 lies within the dashed line boundary 248 surrounding circuitry 250). Similarly, if it is determined that one of digital signal processing blocks 252 should be strengthened, layer 218 can be patterned to cover that block 252. Within circuits T1, T2, T3, . . . , a pattern of layer 218 may be automatically selected to locally enhance transistor strength while allowing transistors that do not require enhanced strength to function with their nominal (unenhanced) strength, thereby minimizing power consumption.

Figure 10:
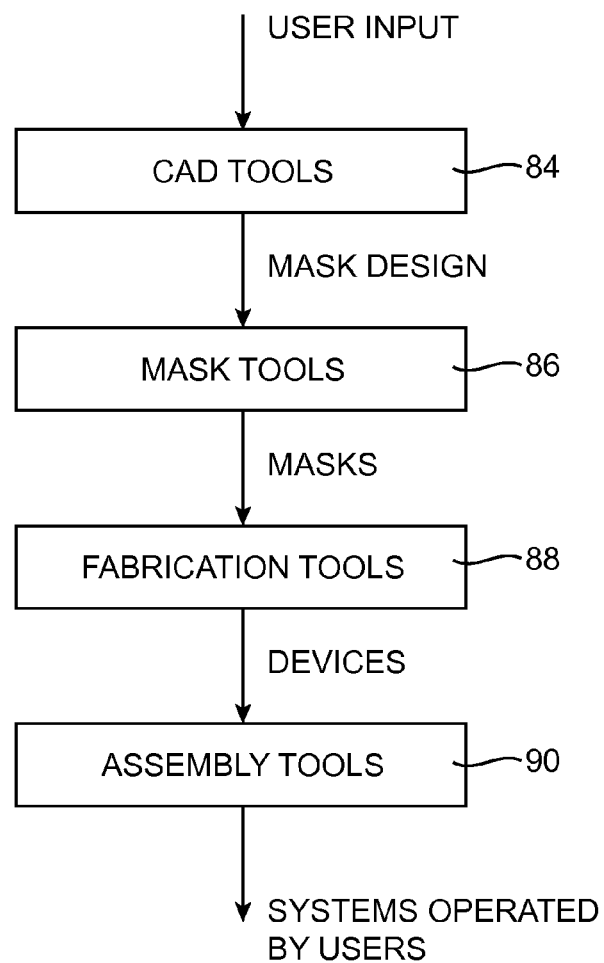
FIG. 10 is an exemplary diagram of tools to produce integrated circuits with locally patterned layers of heat absorbing material in accordance with an embodiment of the present invention.

FIG. 10 shows illustrative equipment that may be used in fabricating integrated circuits with blocks of enhanced-strength transistors.

At shown in FIG. 10, CAD tools 84 may receive a circuit design from a circuit designer as input. CAD tools 84 may be implemented on computing equipment formed from one or more computers (e.g., networked computers). A circuit designer may supply input by entering design code using a design editor, by retrieving design data from a library, by using design entry wizards, or by using other design entry tools in CAD tools 84.

CAD tools 84 may produce a mask design as an output in response to processing the circuit design input. The mask design may include masks for implementing a custom circuit design (e.g., an application-specific integrated circuit) or other suitable integrated circuit (e.g., a mask-programmed integrated circuit). In producing the designs for the masks, CAD tools 84 may produce a pattern of masks for creating a pattern of vias 256 or other connections to implement the design (e.g., to implement a design within a mask-programmed integrated circuit). CAD tools 84 may also produce a mask design for the mask to be used in patterning heat-absorbing (reflecting) layer 218.

CAD tools 84 may make design tradeoffs to maximize transistor speed (e.g., by locally enhancing transistor strength using appropriate portions of layer 218) in an appropriate subset of the blocks of circuitry on integrated circuit 200 while minimizing power consumption (e.g., by avoiding use of layer 218 and thereby declining to strengthen transistor strength) in other blocks of circuitry on integrated circuit 200. These design tradeoffs may be embodied in the mask design produced by CAD tools 84.

The mask design may be converted into a mask set by mask tools 86. Masks from mask tools 86 may be used by semiconductor fabrication tools 88 (e.g., photolithography tools and associated processing tools) to fabricate integrated circuits. The fabricated devices can be mounted on printed circuit boards and can be assembled to form finished systems that are operated by users.

Figure 11:
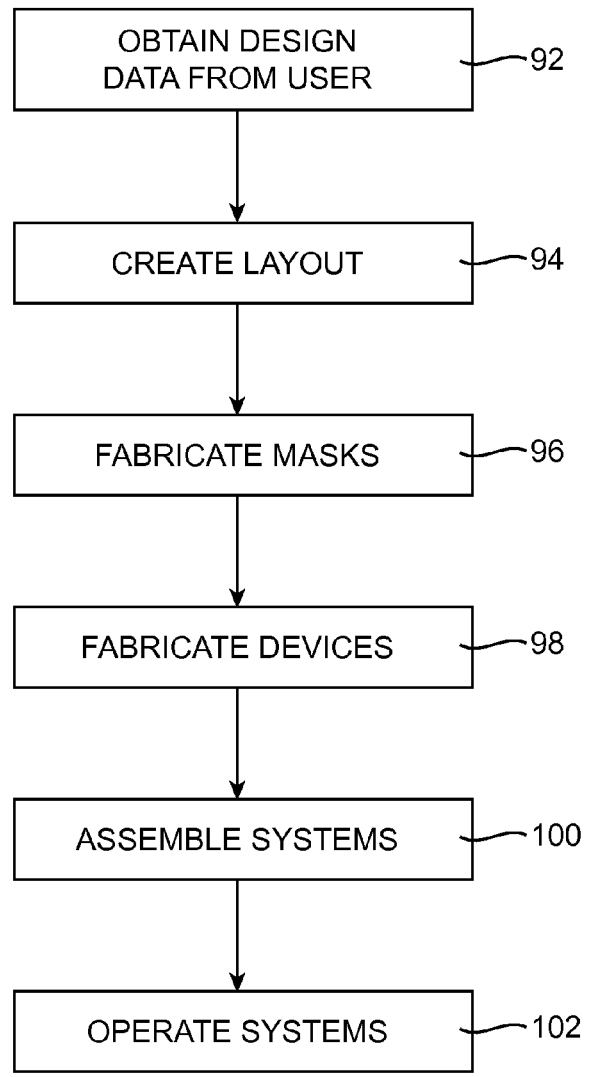
FIG. 11 is an exemplary flow chart for producing integrated circuits with locally altered performance using tools of the type shown in FIG. 10 in accordance with an embodiment of the present invention.

A flow chart of illustrative steps involved in designing, fabricating, and using an integrated circuit containing a patterned layer such as layer 218 to produce localized heating and therefore localized transistor strength adjustments is shown in FIG. 11.

At step 92, a circuit design may be obtained from a circuit designer using CAD tools 84 (FIG. 10). The circuit design may include circuits for audio processing, video processing, communications, memory management, data processing, etc. The circuit design may include design constraints on timing, power consumption, area, voltages, currents, logic functionality, etc. The circuit designs may be associated with a custom integrated circuit (e.g., an application-specific integrated circuit) or may be associated with circuit that is to be implemented using a set of custom masks in a mask-programmed integrated circuit or other programmable integrated circuit (as examples).

At step 94, CAD tools 84 may create a layout for the structures associated with the circuit design (e.g., transistors and/or masks for via programming or other mask-programming in a mask-programmed device) and may create a layout for the mask to be used in patterning layer 218. The mask designs produced during the operations of step 94 may be associated with a circuit design layout that satisfies design constraints that were gathered during the operations of step 92 taking into consideration appropriate location(s) in which the material of heat-absorbing layer 218 is to be used. For example, power consumption constraints may dictate that 95% of all transistors on circuit 200 should exhibit minimal leakage current and therefore should not be locally strengthened using part of layer 218. Power consumption constraints may also dictate that 5% of the transistors on circuit 200 such as the transistors in high performance circuits such as digital signal processing blocks, input-output communications circuits, wireless transceivers, or other subset of the blocks of transistors on device 200 should be strengthened. In this situation, the mask designs that are produced by the computer-aided design tools during the operations of step 94 may include a layout for the heat-absorbing layer mask that only places portions of layer 218 over the select (5%) portion of the transistors that are to be strengthened, while leaving the remaining (95%) of the transistors uncovered by heat-absorbing material 218.

At step 96, mask fabrication tools 88 (FIG. 10) may be used to create photolithographic masks that include the layout produced by the CAD tools (e.g., a mask for patterning heat-absorbing layer 218 and other masks).

At step 98, semiconductor fabrication tools 88 (FIG. 10) may be used to fabricate integrated circuits that include locally strengthened blocks of transistors (e.g., transistors included within one or more of the illustrative dashed line rectangles of FIG. 9).

At step 100, the devices may be assembled to form systems. For example, packaged integrated circuits may be mounted on a printed circuit board and installed within an electronic device.

At step 102, a user may operate the electronic device and the transistors within the integrated circuit in the device.

The foregoing is merely illustrative of the principles of this invention and various modifications can be made by those skilled in the art without departing from the scope and spirit of the invention.

What is claimed is:

1. A method for fabricating an integrated circuit, said method comprising:
    forming blocks of transistors in a semiconductor substrate;
    strengthening a selected first subset of the blocks of transistors by reducing the channel lengths of the transistors in the first subset of the blocks, wherein reducing the channel lengths of the transistors in the first subset of the blocks comprises:
        forming a patterned layer of material on the semiconductor substrate to cover the selected first subset of the blocks of transistors and leaving a second subset of the blocks of transistors uncovered by the patterned layer of material; and
        applying heat to the substrate that heats the selected first subset of the blocks of transistors covered by the patterned layer of material to a different temperature than the second subset of the blocks of transistors that is not covered by the patterned layer of material such that dopant diffuses more in the transistors of the selected first subset of the blocks of transistors than in the transistors of the second subset of the blocks of transistors, the channel lengths of the transistors of the selected first subset of the blocks are reduced by more than the channel lengths of the transistors of the second subset of the blocks of transistors, and the strengths of the transistors of the selected first subset of the blocks are increased; and
    removing the patterned layer of material.

2. The method defined in claim 1, wherein the layer of material comprises amorphous carbon.

3. The method defined in claim 2, wherein applying the heat comprises applying infrared light to the semiconductor substrate using an infrared lamp in an annealing tool.

4. The method defined in claim 2, wherein applying the heat comprises applying heat to the semiconductor substrate using a furnace.

5. The method defined in claim 1, wherein the patterned layer of material comprises an anti-reflection coating, and wherein applying the heat to the substrate heats the selected first subset of the blocks of transistors covered by the patterned layer of material to a higher temperature than the second subset of the blocks of transistors that is not covered by the patterned layer of material.

6. The method defined in claim 1 further comprising:
    identifying a transceiver circuit and including transistors that form the transceiver circuit within the selected first subset of the blocks of transistors that are strengthened.

7. The method defined in claim 1 further comprising:
    identifying at least one processing block that requires rapid transistor switching times and including transistors that form the processing block within the selected first subset of the blocks of transistors that are strengthened.

8. The method defined in claim 1 further comprising:
    identifying at least one circuit for which reduced leakage currents are preferred over maximum switching speed and including transistors that form the circuit within the second subset of the blocks of transistors.

9. A method comprising:
    analyzing a circuit design for an integrated circuit using a computer-aided design tool to identify a first transistor having a greater strength requirement than a second transistor;
    forming the first and second transistors on a semiconductor substrate by:
        forming at least one doped well layer on the substrate;
        forming at least first and second transistors in the well, wherein the first and second transistors initially have identical channel lengths; and
        strengthening the first transistor such that the first transistor has a greater strength than the second transistor by reducing the channel length of the first transistor, wherein reducing the channel length of the first transistor comprises:
            covering the first transistor with an anti-reflection coating layer and leaving the second transistor uncovered by the anti-reflection coating; and
            applying infrared light to the first and second transistors, wherein the first transistor covered by the anti-reflection coating absorbs more of the infrared light than the second transistors such that dopant diffuses more in the first transistor than in the second transistor responsive to the applying the infrared light, the channel length of the first transistor is reduced, and the strength of the first transistor is increased.

10. The method defined in claim 9 further comprising:
    removing the anti-reflection coating layer from the first transistor.

11. The method defined in claim 10, wherein applying the infrared light heats the first transistor to a first temperature and heats the second transistor to a second temperature, wherein the first temperature is greater than the second temperature, and wherein the first temperature is at least equal to 950° C.

12. The method defined in claim 9, wherein covering the first transistor comprises depositing a layer of amorphous material over the first transistor.

13. The method defined in claim 12, wherein covering the first transistor comprises dry etching the deposited amorphous material to uncover the second transistor.

14. The method defined in claim 13, wherein depositing the layer comprises depositing a layer of amorphous carbon.

* * * * *